United States Patent [19]

Davies et al.

[11] Patent Number: 4,967,336

[45] Date of Patent: Oct. 30, 1990

[54] HIGH VOLTAGE BRIDGE INTERFACE

[75] Inventors: Robert B. Davies; Warren J. Schultz, both of Tempe; James J. Stipanuk, Chandler, all of Ariz.

[73] Assignee: Motorola, Inc., Schaumburg, Ill.

[21] Appl. No.: 484,946

[22] Filed: Feb. 26, 1990

[51] Int. Cl.[5] .......................................... H02M 7/5387
[52] U.S. Cl. ...................................... 363/132; 363/17; 363/98
[58] Field of Search ............................. 363/17, 98, 132

[56] References Cited

U.S. PATENT DOCUMENTS

| | | | |
|---|---|---|---|
| 4,513,362 | 4/1985 | Aizawa | 363/98 |
| 4,546,422 | 10/1985 | Okado | 363/132 |
| 4,597,037 | 6/1986 | Okado | 363/98 |
| 4,819,157 | 4/1989 | Hirose et al. | 363/98 |
| 4,903,187 | 2/1990 | Doi et al. | 363/98 |
| 4,905,135 | 2/1990 | Unehara et al. | 363/17 |

Primary Examiner—Steven L. Stephan
Assistant Examiner—Jeffrey Sterrett
Attorney, Agent, or Firm—Michael D. Bingham; Robert D. Atkins

[57] ABSTRACT

A high voltage bridge interface circuit is provided for AC and brushless DC motor control having a high voltage isolation circuit and drive circuits which simplify the high voltage interface and reduce the total system integration effort. The isolation circuit provides the high voltage unilateral isolation between the control circuit and the high voltage power supply conductors, while the drive circuits improve the noise immunity at the gate termimals of the power MOSFET bridge. The high voltage bridge interface circuit is partitioned by providing the high voltage interface within one IC thereby permitting the integration of the discrete components of the power MOSFET drive circuits and simplifying the overall system integration.

15 Claims, 2 Drawing Sheets

HIGH VOLTAGE BRIDGE INTERFACE

CROSS REFERENCE TO RELATED PATENT APPLICATION

This application is related to copending U.S. patent application Ser. No. 459,506, "INTEGRATED HIGH VOLTAGE TRANSISTORS HAVING MINIMUM TRANSISTOR TO TRANSISTOR CROSSTALK", filed Jan. 2, 1990, and assigned to the same assignee, Motorola, Inc.

BACKGROUND OF THE INVENTION

This invention relates in general to motor controllers, and more particularly, to a high voltage bridge interface for AC (alternating current) and brushless DC (direct current) motor control partitioned for providing unilateral isolation between the control circuits and the high voltage power supply lines while improving the noise immunity and simplifying the total system integration.

Electric motors are common place in virtually all facets of the commercial and private sectors of modern society. The typical electric motor includes stationary stator windings magnetically coupled to the rotor windings which are an integral part of the rotating internal assembly. A motor control circuit regulates the current flow into the stator windings thereby controlling the energy transfer through the magnetic flux linkages to the rotor windings inducing current to flow through the latter and creating torque against the mechanical load. In brushless DC motors, for example, the stator windings are typically energized in a conventional three-phase manner to maintain a more uniform magnetic field about the rotor. The motor control circuit may include a power MOSFET (metal oxide semiconductor with field effect transistors) bridge having three pairs of transistors serially coupled between first and second power supply conductors operating at a predetermined DC value, i.e., 300 VDC, and ground potential, respectively, and a control circuit, such as Motorola, Inc. part number MC33034, for providing six output signals to turn the power MOSFETs on and off in an alternating manner and conduct the three-phase stator currents, as is understood. Although the gate terminals of the bottom-side power MOSFETs (ones having their source terminals coupled to the second power supply conductor) are often driven directly by the control circuit, the top-side power MOSFETs (ones having their drain terminals coupled to the first power supply conductor) require three turn-on/turn-off drive circuits coupled between the control circuit and the respective gate terminals thereof because of the full scale voltage swing between the first and second power supply conductors developed at the source terminals of the top-side power MOSFETs. In this configuration, the bottom-side MOSFETs are pulse width modulated (PWM) via the control circuit for controlling the rotational speed within the on-period while the top-side MOSFETs are commutated to steer the stator currents. In addition, the drive circuit uses a charge pump referenced to the first power supply conductor to raise the gate potentials of the top-side power MOSFETs above the source potentials of the same in order to achieve conduction therethrough.

The components of the conventional motor control circuit, i.e., charge pump and three drive circuits are complex and traditionally realized in discrete form principally for maintaining isolation between the control circuit and the high voltage power supply conductors. However, this topology is susceptible to noise because of the extreme voltage swing at the source terminals of the bottom-side power MOSFETs which operate at a higher PWM frequency whereby the top-side transistors may be rendered conductive or non-conductive at the inappropriate time. Hence, it would be desirable to pulse width modulate the top-side power MOSFETs and communtate the bottom-side power MOSFETs thereby improving the noise immunity of the motor control circuit and providing smoother motor starts under loaded conditions. In addition, since the commercial success of electric motors is often linked to the manufacturing and total system integration effort, it would also be desirable to reduce the cost associated therewith especially in high volume applications by partitioning the motor control circuit into a minimum number of integrated circuits (IC) while maintaining the high voltage isolation thereby avoiding the large number of discrete components prevalent in the prior art.

Hence, what is needed is an improved motor control circuit properly partitioned into a minimal number of ICs for providing unilateral isolation between the control circuit and the high voltage power supply lines while improving the noise immunity at the gate terminals of the power MOSFETs and simplifying the system integration.

SUMMARY OF THE INVENTION

Accordingly, it is an objective of the present invention to provide an improved motor control circuit.

A further objective of the present invention is to provide an improved motor control circuit including a power MOSFET bridge responsive to a control circuit for providing three-phase current to the stator windings of an AC or brushless DC electric motor.

Another further objective of the present invention is to provide an improved motor control circuit partitioned for providing a high voltage bridge interface to maintain unilateral isolation between the control circuit and the high voltage power supply lines supplying the MOSFET bridge.

Yet another objective of the present invention is to provide an improved high voltage bridge interface circuit having a reduced number of components for simplifying the total system integration.

Still another objective of the present invention is to provide an improved high voltage bridge interface circuit for providing improved noise immunity at the gate terminals of the power MOSFET bridge.

In accordance with the above and other objectives there is provided a circuit for sinking and sourcing current through an output to the stator windings of an electric motor comprising, first and second power transistors each having a gate terminal, a source terminal and a drain terminal, the drain terminal of the first power transistor being coupled to a first source of operating potential, the source terminal of the second power transistor being coupled to a second source of operating potential, the source terminal of the first power transistor and the drain terminal of the second power transistor being coupled together to the output; a first circuit having a plurality of outputs for providing a plurality of control signals having a predetermined phase relationship therebetween; a second circuit for enabling and disabling a plurality of output signals in response to the plurality of control signals while providing unilateral isolation for the first circuit from the potential developed across the first and second sources of operating potential; and first and second drive circuits each having an input and first and second outputs, the inputs being coupled for receiving first and second ones of the plurality of output signals of the second circuit, the first outputs being respectively coupled to the gate terminals of the first and second power transistors, the second outputs being respectively coupled to the source terminals of the first and second power transistors.

DETAILED DESCRIPTION OF THE PREFERRED EMBODIMENT

Figure 1:
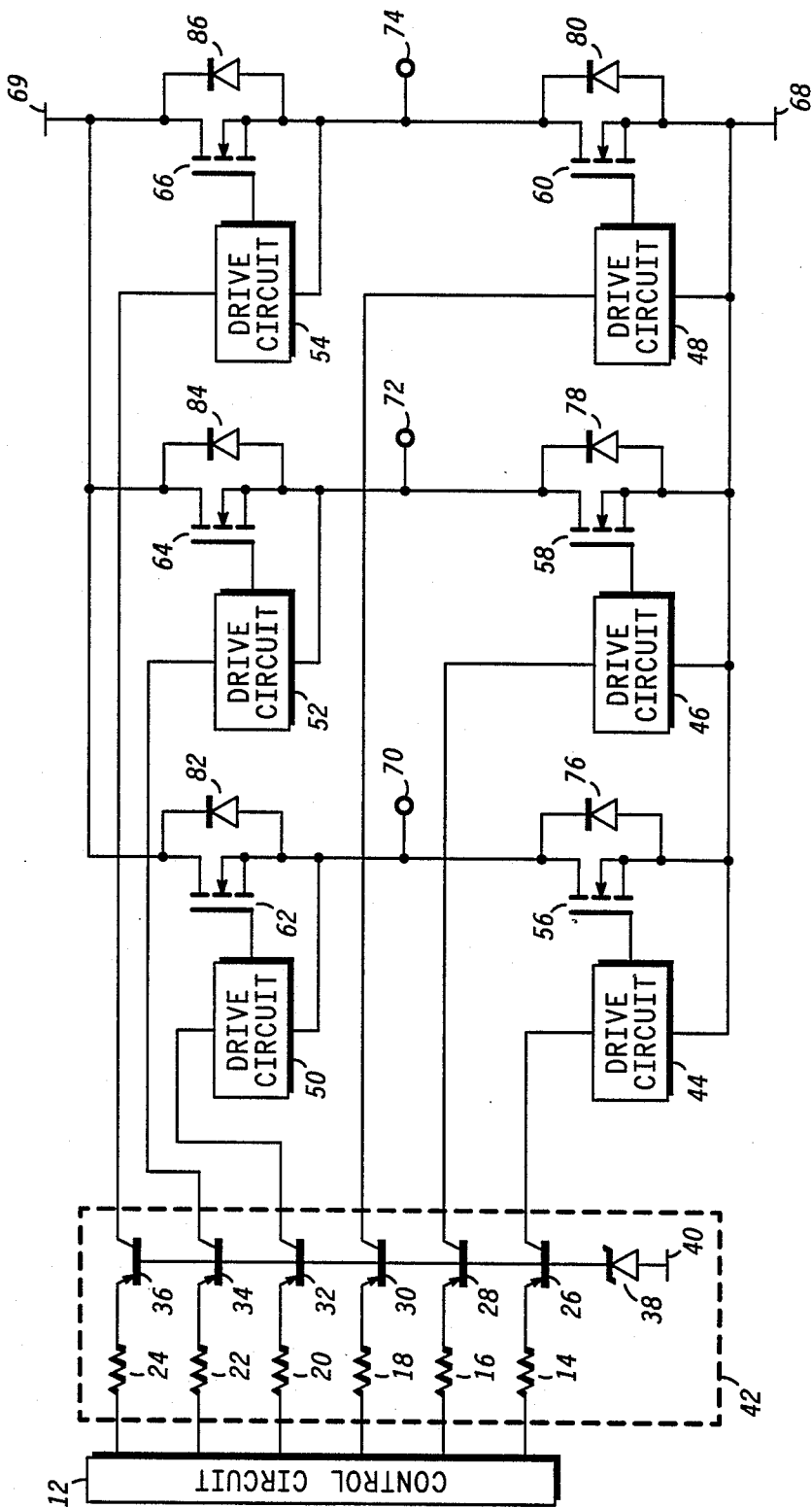
FIG. 1 is a simplified schematic and block diagram illustrating the preferred embodiment of the present invention.

Referring to FIG. 1, high voltage bridge interface circuit 10 is shown including control circuit 12 having six output terminals coupled through resistors 14, 16, 18, 20, 22, and 24, respectively, to the emitters of PNP transistors 26, 28, 30, 32, 34 and 36. The bases of PNP transistors 26–36 are commonly coupled to the cathode of zener diode 38, while the anode is coupled to power supply conductor 40 typically operating at ground potential. Resistors 14–24, PNP transistors 26–36 and zener diode 38 comprise high voltage isolation circuit 42. The collectors of PNP transistors 26–36 are coupled to the inputs of turn-on/turn-off drive circuits 44, 46, 48, 50, 52, and 54, while the first outputs of drive circuits 44–54 are coupled to the gate terminals of transistors 56, 58, 60, 62, 64, and 66, respectively. Transistors 56–66 are typically discrete power MOSFET devices. The source terminals of transistors 56, 58, and 60 are coupled to the second outputs of drive circuits 44, 46, and 48, respectively, and to power supply conductor 68 typically operating at −300 volts DC. The drain terminals of transistors 62, 64, and 66 are coupled to power supply conductor 69, while the source terminals of the same are coupled to the second outputs of drive circuits 50, 52, and 54 and to the drain terminals of transistors 56, 58, and 60, respectively. Outputs 70, 72, and 74 are coupled to the stator windings of an AC or brushless DC motor at the drain terminals of transistors 56, 58, and 60, respectively. In addition, diodes 76, 78, 80, 82, 84, and 86 are coupled between the drain and source terminals of transistors 56–66 for providing conventional reverse bias protection.

Figure 2:
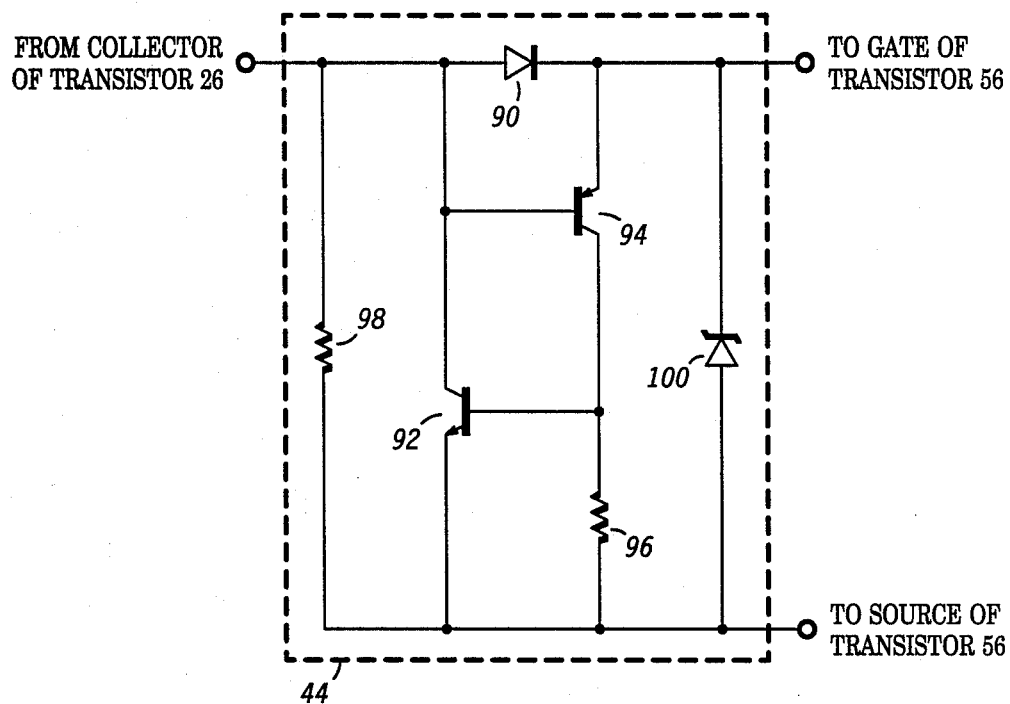
FIG. 2 is a schematic diagram illustrating additional detail of one aspect of the present invention.

Turning to FIG. 2, there is shown additional detail of drive circuit 44 including diode 90 having anode and cathode terminals coupled to the input and first output of drive circuit 44, respectively. The collector of transistor 92 is coupled to the anode of diode 90, while the emitter is coupled to the second output of drive circuit 44. The collector and base of transistor 92 are coupled to the base and collector of transistor 94, respectively, and the emitter of the latter is coupled to the cathode of diode 90. Resistor 96 is coupled between the base and emitter of transistor 92, and resistor 98 is coupled between the collector and emitter of transistor 92. In addition, zener diode 100 is coupled between the first and second outputs of drive circuit 44 for supplying a positive clamp at the first output with respect to the second output thereof.

The operation of high voltage bridge interface circuit 10 proceeds as follows. The six output terminals of control circuit 12 develop output voltage pulses each having a predetermined phase relationship, such as disclosed in the literature for Motorola part number MC33034. The output terminals of control circuit 12 are commonly known as phase-A, phase-B and phase-C; bottom-side and top-side output terminals. The phase-A bottom-side and phase-A top-side output terminals may for example be coupled to resistors 14 and 20, while the phase-B bottom-side and phase-B top-side output terminals are coupled to resistors 16 and 22, respectively. Briefly, the bottom-side and top-side output pulses of a particular phase have approximate 30 degrees of phase shift therebetween, e.g., there is 30 degree phase differential between phase-A bottom-side and phase-A top-side output pulses. Furthermore, there is 120 degree phase relationship between the phase-A, phase-B and phase-C common output pulses. Notably, in order to use the MC33034 motor control circuit, it is necessary to install a metal mask option wherein the top-side output pulses are inverted and the bottom-side and top-side output terminals are swapped relative to the standard part usage. For example, the standard part phase-A top-side output is inverted and coupled to the conduction path leading to the phase-A bottom-side transistor, while the standard part phase-A bottom-side output terminal is coupled to the conduction path leading to phase-A top-side transistor. In this configuration, the top-side transistors are pulse width modulated via control circuit 12 to control the rotational speed within the on-period, while the bottom-side transistors are commutated to steer the stator currents. A common base operating frequency for control circuit 12 is 25 KHz.

Consider the point of operation wherein the output pulse of the phase-A top-side output terminal is high which forward biases the base-emitter junction of transistor 26 and enables the conduction path through resistor 14 and transistor 26 allowing current to flow into drive circuit 44. Since one of the six output pulses of control circuit 12 is always high, zener diode 38 maintains a constant reference potential, say 15.5 VDC with respect to the ground potential, at the common bases of transistors 26–36. Continuing with FIG. 2, the current flowing through the input of drive circuit 44 forward biases diode 90 completing the conduction path to the gate of transistor 56. The potential developed at the gate of transistor 56 increases and clamps to zener voltage, approximately 10.4 volts, rendering it conductive and pulling the voltage at output 70 to one saturation potential above power supply conductor 68 thereby sinking current from the phase-A stator winding. The excess current not required by transistor 56 flows through zener diode 100 into the source terminal of transistor 56. The forward biased state of diode 90 reverse biases the base-emitter junction of transistor 94 turn it off as well as transistor 92.

Approximately 60 degrees later in the cycle the output pulse of the phase-A bottom-side output terminal drops low, turning transistor 26 off, disabling the input current to drive circuit 44 and rendering diode 90 nonconductive. The charge stored in the gate terminal of transistor 56 forward biases the base-emitter junction of transistor 94 via resistor 98 enabling the conduction path through resistor 96 which develops a potential at the base of transistor 92 turning the latter on and developing an SCR-type (silicon controlled rectifier) latch wherein transistors 92 and 94 each maintain the other in conduction. As a result, the gate potential of transistor 56 is pulled toward the source potential turning it off rather expeditiously. At the same time that the output pulse of the phase-A bottom-side output terminal drops low, the output pulse of the phase-C bottom-side output terminal transitions high turning on transistor 60 via drive circuit 48 in the same manner described for drive circuit 44 thereby commencing the phase-C sub-cycle. Another 30 degrees after the output pulse of the phase-A bottom-side output terminal drops low, the output pulse of the phase-A top-side output terminal goes high turning on transistor 62 through drive circuit 50. The drain-source conduction path through transistor 62 supplies current from power supply conductor 69 through output 70 into the phase-A stator windings. Likewise, the phase-B and phase-C sub-cycles source and sink stator current through outputs 72 and 74. Notably, resistors 14–24 should be selected such that at least two milliamps (ma) of current flows into the associated drive circuits; one ma of current to maintain the conduction through zener diode 100 and one ma of current flowing through resistor 98. Drive circuits 46, 48, 50, 52 and 54 comprise the same components and operate as described for drive circuit 44.

One key feature of the present invention is the combination of high voltage isolation circuit 42 and drive circuits 44–54 which simplifies the high voltage interface and reduces the total system integration effort. High voltage isolation circuit 42 provides unilateral isolation between control circuit 12 and high voltage power supply conductors 68 and 69. When PNP transistors 26–36 are conducting the potentials developed at the collectors thereof can reach −300 VDC; however, the potentials at the emitters never exceed the operating potential of control circuit 12, thus, the high voltage between power supply conductors 68 and 68 is maintained across the collector-emitter junctions of PNP transistors 26–36 and never reaches control circuit 12. The gate-source potentials of transistors 56–66 are established via zener diode 100 referenced to the source terminal thereof and enabled through the current flowing through PNP transistors 26–36 into drive circuits 44–54, respectively, thereby eliminating the need for an extraneous charge pump circuit. Furthermore, since the top-side transistors are the ones pulse width modulated, the source terminals of the bottom-side transistors are essentially at AC ground thereby providing a greatly reduced voltage swing at the gate terminals of the latter which improves the noise immunity for the power MOSFETs.

Moreover, the functional distribution of the present invention lends itself to improved partitioning and system integration. In one embodiment, control circuit 12 is enclosed in one IC while high voltage isolation circuit 42 including resistors 14–24, PNP transistors 26–36 and zener diode 38 comprise another IC, hence, the control IC (12) is physically separated from the high voltage interface IC (42). Drive circuits 44–54 may also be integrated into one IC, or separated into six individual ICs. Typically, power MOSFETs 56–66 are discrete devices. Hence, the present invention has partitioned the motor control components by providing the high voltage interface within one IC thereby permitting integration of the discrete components of the power MOSFET drive circuits and simplifying the overall system integration.

By now it should be appreciated that what has been described is a novel high voltage bridge interface circuit partitioned for providing unilateral isolation between the high voltage power supply lines and the control circuit while improving the noise immunity at the gate terminals of the power MOSFETs and lowering the overall cost of system integration.

We claim:

1. A method of partitioning a motor control circuit, comprising the steps of:
    developing a plurality of control signals having a predetermined phase relationship therebetween;
    supplying output current through a plurality of power transistors coupled between high voltage power supply conductors in response to a plurality of output signals wherein the output current is sourced and sunk through the output of the motor control circuit; and
    enabling a plurality of transistors each having a base, an emitter and a collector, said bases being coupled together to a source of operating potential, said emitters being coupled for receiving ones of said plurality of control signals, said collectors being coupled for supplying respective ones of said plurality of output signals in response to said plurality of control signals while maintaining unilateral isolation for said plurality of control signals from said high voltage power supply conductors.

2. A circuit for sinking and sourcing current through an output, comprising:
    first and second power transistors each having a gate terminal, a source terminal and a drain terminal, said drain terminal of said first power transistor being coupled to a first source of operating potential, said source terminal of said second power transistor being coupled to a second source of operating potential, said source terminal of said first power transistor and said drain terminal of said second power transistor being coupled together and to the output;
    first means having a plurality of outputs for providing a plurality of control signals having a predetermined phase relationship therebetween;
    second means responsive to said plurality of control signals for enabling and disabling a plurality of output signals while providing unilateral isolation for said first means from the potential developed across said first and second sources of operating potential, wherein said second means includes a plurality of transistors each having a base, an emitter and a collector, said bases being coupled together to a third source of operating potential, said emitters being coupled for receiving ones of said plurality of control signals, said collectors of first and second ones of said plurality of transistors being coupled to said inputs of said first and second drive circuits for providing said plurality of output signals; and
    first and second drive circuits each having an input and first and second outputs, said inputs being coupled for receiving first and second ones of said plurality of output signals of said second means respectively, said first outputs being respectively coupled to said gate terminals of said first and second power transistors, said second outputs being respectively coupled to said source terminals of said first and second power transistors.

3. The circuit of claim 2 wherein said second means further includes:

a plurality of resistors respectively coupled between said plurality of outputs of said first means and said emitters of said plurality of transistors; and a zener diode coupled between said bases of said plurality of transistors and said third source of operating potential oriented for providing a positive potential at said bases of said plurality of transistors with respect to said third source of operating potential.

4. The circuit of claim 3 wherein said plurality of transistors are PNP transistors.

5. The circuit of claim 4 wherein said first drive circuit includes:

first diode means having an anode coupled to said input of said first drive circuit and having a cathode coupled to said first output of said first drive circuit;

a first transistor having a base, an emitter and a collector, said collector being coupled to said anode of said first diode means, said emitter being coupled to said second output of said first drive circuit;

a second transistor having a base, an emitter and a collector, said base being coupled to said collector of said first transistor, said emitter being coupled to said cathode of said first diode means, said collector being coupled to said base of said first transistor;

a first resistor coupled between said base and emitter of said first transistor;

a second resistor coupled between said collector and emitter of said first transistor; and second diode means having a cathode coupled to said first output of said first drive circuit and having an anode coupled to said second output of said first drive circuit.

6. The circuit of claim 5 wherein said second diode means includes a zener diode oriented for providing a positive potential at said first output of said first drive circuit with respect to the potential developed at said second output of said first drive circuit.

7. The circuit of claim 6 further including:

a third power transistor having a gate terminal and a source terminal and having a drain terminal coupled to said first source of operating potential;

a fourth power transistor having a gate terminal, a source terminal and a drain terminal, said source terminal being coupled to said second source of operating potential, said drain terminal of said fourth power transistor and said source terminal of said third power transistor being coupled together to a second output;

a third drive circuit having an input and first and second outputs, said input being coupled to said collector of a third one of said plurality of transistors, said first output being coupled to said gate terminal of said third power transistor, said second output being coupled to said source terminal of said third power transistor; and a fourth drive circuit having an input and first and second outputs, said input being coupled to said collector of a fourth one of said plurality of transistors, said first output being coupled to said gate terminal of said fourth power transistor, said second output being coupled to said source terminal of said fourth power transistor.

8. The circuit of claim 7 further including:

a fifth power transistor having a gate terminal and a source terminal and having a drain terminal coupled to said first source of operating potential;

a sixth power transistor having a gate terminal, a source terminal and a drain terminal, said source terminal being coupled to said second source of operating potential, said drain terminal of said sixth power transistor and said source terminal of said fifth power transistor being coupled together to a third output;

a fifth drive circuit having an input and first and second outputs, said input being coupled to said collector of a fifth one of said plurality of transistors, said first output being coupled to said gate terminal of said fifth power transistor, said second output being coupled to said source terminal of said fifth power transistor; and a sixth drive circuit having an input and first and second outputs, said input being coupled to said collector of a sixth one of said plurality of transistors, said first output being coupled to said gate terminal of said sixth power transistor, said second output being coupled to said source terminal of said sixth power transistor.

9. A high voltage bridge interface circuit for sinking and sourcing current through an output to the stator windings of an electric motor and including a control circuit for providing a plurality of control signals having a predetermined phase relationship therebetween; and first and second power transistors each having a gate terminal, a source terminal and a drain terminal, the drain terminal of the first power transistor being coupled to a first source of operating potential, the source terminal of the second power transistor being coupled to a second source of operating potential, the source terminal of the first power transistor and the drain terminal of the second power transistor being coupled to the output, wherein the improvement comprises:

a plurality of transistors each having a base, an emitter and a collector, said bases being coupled together to a third source of operating potential, said emitters being coupled for receiving ones of the plurality of control signals, said collectors providing a plurality of output signals, wherein said plurality of transistors provides unilateral isolation for the control circuit from the potential developed across the first and second sources of operating potential; and first and second drive circuits each having an input and first and second outputs, said inputs being coupled to said collectors of first and second ones of said plurality of transistors, said first outputs being respectively coupled to the gate terminals of the first and second power transistors, said second outputs being respectively coupled to the source terminals of the first and second power transistors.

10. The high voltage bridge interface circuit of claim 9 further including:

a plurality of resistors respectively coupled between the outputs of the control circuit and said emitters of said plurality of transistors; and a zener diode coupled between said bases of said plurality of transistors and said third source of operating potential oriented for providing a positive potential at said bases of said plurality of transistors with respect to said third source of operating potential.

11. The high voltage bridge interface circuit of claim 10 wherein said plurality of transistors are PNP transistors.

12. The high voltage bridge interface circuit of claim 11 wherein said first drive circuit includes:
   first diode means having an anode coupled to said input of said first drive circuit and having a cathode coupled to said first output of said first drive circuit;
   a first transistor having a base, an emitter and a collector, said collector being coupled to said anode of said first diode means, said emitter being coupled to said second output of said first drive circuit;
   a second transistor having a base, an emitter and a collector, said base being coupled to said collector of said first transistor, said emitter being coupled to said cathode of said first diode means, said collector being coupled to said base of said first transistor;
   a first resistor coupled between said base and emitter of said first transistor;
   a second resistor coupled between said collector and emitter of said first transistor; and
   second diode means having a cathode coupled to said first output of said first drive circuit and having an anode coupled to said second output of said first drive circuit.

13. The high voltage bridge interface circuit of claim 12 wherein said second diode means includes a zener diode oriented for providing a positive potential at said first output of said first drive circuit with respect to the potential developed at said second output of said first drive circuit.

14. The high voltage bridge interface circuit of claim 13 further including:
   a third power transistor having a gate terminal and a source terminal and having a drain terminal coupled to the first source of operating potential;
   a fourth power transistor having a gate terminal, a source terminal and a drain terminal, said source terminal being coupled to the second source of operating potential, said drain terminal of said fourth power transistor and said source terminal of said third power transistor being coupled together to a second output;
   a third drive circuit having an input and first and second outputs, said input being coupled to said collector of a third one of said plurality of transistors, said first output being coupled to said gate terminal of said third power transistor, said second output being coupled to said source terminal of said third power transistor; and
   a fourth drive circuit having an input and first and second outputs, said input being coupled to said collector of a fourth one of said plurality of transistors, said first output being coupled to said gate terminal of said fourth power transistor, said second output being coupled to said source terminal of said fourth power transistor.

15. The high voltage bridge interface circuit of claim 14 further including:
   a fifth power transistor having a gate terminal and a source terminal and having a drain terminal coupled to the first source of operating potential;
   a sixth power transistor having a gate terminal, a source terminal and a drain terminal, said source terminal being coupled to the second source of operating potential, said drain terminal of said sixth power transistor and said source terminal of said fifth power transistor being coupled together to a third output;
   a fifth drive circuit having an input and first and second outputs, said input being coupled to said collector of a fifth one of said plurality of transistors, said first output being coupled to said gate terminal of said fifth power transistor, said second output being coupled to said source terminal of said fifth power transistor; and
   a sixth drive circuit having an input and first and second outputs, said input being coupled to said collector of a sixth one of said plurality of transistors, said first output being coupled to said gate terminal of said sixth power transistor, said second output being coupled to said source terminal of said sixth power transistor.

* * * * *